United States Patent
Claiborne et al.

(10) Patent No.: US 6,452,187 B1
(45) Date of Patent: Sep. 17, 2002

(54) TWO-COLOR GRATING COUPLED INFRARED PHOTODETECTOR

(75) Inventors: Lewis Taylor Claiborne, Richardson; Pradip Mitra, Grand Prairie, both of TX (US)

(73) Assignee: Lockheed Martin Corporation, Bethesda, MD (US)

( * ) Notice: Subject to any disclaimer, the term of this patent is extended or adjusted under 35 U.S.C. 154(b) by 71 days.

(21) Appl. No.: 09/645,377

(22) Filed: Aug. 24, 2000

(51) Int. Cl.[7] ............................................. H01L 31/09
(52) U.S. Cl. .............................. 250/370.12; 250/370.13
(58) Field of Search ....................... 250/370.12, 370.13, 250/216, 338.4, 339.01, 339.02, 226, 214.1; 359/565, 615, 900, 248; 257/17, 25; 372/45

(56) References Cited

U.S. PATENT DOCUMENTS

| | | | |
|---|---|---|---|
| 5,113,076 A | * 5/1992 | Schulte | 250/370.06 |
| 5,144,138 A | * 9/1992 | Kinch et al. | 250/332 |
| 5,315,128 A | 5/1994 | Hunt et al. | 257/16 |
| 5,380,669 A | * 1/1995 | Norton | 437/5 |
| 5,389,797 A | 2/1995 | Bryan et al. | 257/21 |
| 5,455,421 A | 10/1995 | Spears | 250/338.4 |
| 5,479,018 A | 12/1995 | McKee | 250/338.1 |
| 5,485,015 A | 1/1996 | Choi | 257/21 |
| 5,539,206 A | 7/1996 | Schimert | 250/338.4 |
| 5,552,603 A | * 9/1996 | Stokes | 250/338.4 |
| 5,559,336 A | * 9/1996 | Kosai et al. | 250/370.13 |
| 5,726,805 A | 3/1998 | Kaushik et al. | 359/589 |
| 5,773,831 A | 6/1998 | Brouns | 250/370.08 |
| 5,818,066 A | 10/1998 | Duboz et al. | 257/21 |
| 5,965,899 A | * 10/1999 | Little, Jr. | 257/17 |
| 6,013,912 A | * 1/2000 | Pautrat et al. | 250/226 |
| 6,180,990 B1 | * 1/2001 | Claiborne et al. | 257/440 |
| 6,236,508 B1 | * 5/2001 | Stapelbroek | 359/565 |

OTHER PUBLICATIONS

Tsai et al. "Two–dimensional bi–periodic grating coupled one–and two–color quantum well infrared photodetector", IEEE Electron Device Letters, vol. 16, No. 2, Feb. 1995.*

Chen et al., "Two–color corregated quantum well infrared photodetectors for remote temperature sensing", Applied Physics Letters, 1997, pp. 62–63.*

J.–H. Lee, et al., "Investigation of Multi–color, Broadband Quantum Well Infrared Photodetectors with Digital Graded Superlattice Barrier and Linear–Graded Barrier for Long Wavelength Infrared Applications", pp. 1–29.

J.–H. Lee et al., "Quantum–well infrared photodetectors with digital graded superlattice barrier for long–wavelength and broadband detection", *Applied Physics Letters*, American Institute of Physics, vol. 75, No. 20, Nov. 15, 1999, pp. 3207–3209.

C.C. Barron, et al., "Resonant–cavity–enhanced pin photodetector with 17GHz bandwidth–efficiency product", *Electronics Letters*, The Institution of Electrical Engineers, vol. 30, No. 21, Oct. 13, 1994, p. 1 and pp. 1796–1797.

T. Wipiejewski, et al., "Resonant wavelength selective photodetectors", *Microelectronic Engineering* 19, 0167–9317/92, 1992, Elsevier Science Publishers B.V, pp. 223–226.

* cited by examiner

*Primary Examiner*—Constantine Hannaher
*Assistant Examiner*—Otilia Gabor
(74) *Attorney, Agent, or Firm*—Sidley Austin Brown & Wood; Stephen S. Sadacca

(57) ABSTRACT

A two-color photodetector for detecting two different bands of infrared radiation is described. The photodetector includes either a diffractive resonant optical cavity that resonates at the two colors of interest, or a diffractive resonant optical cavity that resonates at the first color and a vertical resonant optical cavity that resonates at the second color. By placing materials that absorb only one of the two colors at the appropriate locations within the resonate structure, the resultant signals include little cross-talk due to the opposite color. The two-color photodetector finds use in applications covering a wide portion of the infrared spectrum.

41 Claims, 5 Drawing Sheets

TWO-COLOR GRATING COUPLED INFRARED PHOTODETECTOR

FIELD OF THE INVENTION

The present invention relates to a photodetector sensitive to infrared radiation. In particular, the present invention provides for a grating coupled photodetector sensitive to radiation in two different infrared wavelength bands and that provides two corresponding output signals.

BACKGROUND OF THE INVENTION

In the field of infrared (IR) imaging, the current objective is to provide large area focal plane arrays at low cost with high performance. InSb, HgCdTe, and quantum well infrared photodetector (QWIP) technologies have demonstrated high performance large area focal plane arrays. Each of these technologies has various strengths and weaknesses. InSb photodetectors offer high performance and ease of fabrication, but must be cooled to approximately 80 K. HgCdTe photodetectors can be designed to operate in either the long wavelength IR (LWIR) corresponding to a wavelength range of 8 to 12 $\mu$m or the middle wavelength IR (MWIR) corresponding to a wavelength range of 3 to 5 $\mu$m. However, HgCdTe photodetectors require very tight tolerances in material and fabrication uniformity to ensure high performance. QWIP photodetectors have been demonstrated in both the MWIR and LWIR requiring only moderate tolerances in both material and fabrication uniformity. However, QWIP photodetectors' performance is generally lower than that achieved by InSb or HgCdTe photodetectors.

Two-color detection is increasingly desirable as a method to increase the probability of detection under various environments. As an example, objects that are only slightly above room temperature, such as a person, are most easily detected in the LWIR corresponding to the peak IR radiation emission band for room temperature objects. In contrast, a hot object, such as an automobile exhaust pipe, can be readily detected in the MWIR corresponding to the peak IR radiation emission band for objects having a temperature more than 600 K. Thus, a system that must provide high performance with either of these objects must be sensitive to both wavelength bands.

In military applications, it is possible to camouflage an object such that the object emits little radiation in a particular portion of the IR spectrum. A two-color photodetector with appropriately selected sensing wavelengths therefore provides a means of detecting objects that have been camouflaged in this manner.

Additional applications may use two-color photodetectors for discriminating one object from another. As two objects at different temperatures emit different amounts of IR radiation at different wavelengths, a two-color photodetector can be used to more readily discriminate between the objects. As an example, two identical cars may be parked next to each other. If one has recently been driven while the second has not been operated for several hours, a two-color detector could readily sense the difference in exhaust pipe or tire temperatures.

However, conventional IR detector technologies have proven difficult to adapt to this current demand for two-color detection. As noted above, high performance single color detectors and imaging arrays have been demonstrated using HgCdTe, InSb, and QWIP technologies. Of these, two-color detection is possible only with the HgCdTe and QWIP technologies. The two-color HgCdTe photodetectors demonstrated to date have suffered significantly from both non-uniformity in the HgCdTe material and the fabrication process. While two-color QWIP photodetectors do not place as stringent requirements upon the starting material, the fabrication process has similarly proven quite difficult. Further, both IR detector technologies have suffered from reduced performance in two-color photodetectors in comparison to single color performance.

In view of the desirability of two-color IR photodetectors, there exists a need for a design that places fewer and/or less stringent requirements upon the starting material and/or the fabrication process.

SUMMARY OF THE INVENTION

In one embodiment of the present invention, a two-color IR photodetector comprises in order, a top electrical contact, a top IR absorbing layer for absorbing a first color, a middle electrical contact, a bottom IR absorbing layer for absorbing a second color, a bottom electrical contact, and a reflector. The top contact and the top IR absorbing layer form a first diffractive grating for the first color. The middle contact and the bottom IR absorbing layer form a second diffractive grating for the second color. The first diffractive grating has a period that is an integer multiple of the period of the second diffractive grating.

In another embodiment of the present invention, a two-color IR photodetector comprises in order, a top electrical contact, a top IR absorbing layer for absorbing a first color, a middle electrical contact, a bottom IR absorbing layer for absorbing a second color, a bottom electrical contact, and a reflector. The top contact, the top IR absorbing layer, the middle contact, and the bottom IR absorbing layer form a doubly periodic diffractive grating. The doubly periodic diffractive grating has a period in a first direction to diffract the first color and a period in a perpendicular direction to diffract the second color.

In yet another embodiment of the present invention, a two-color IR photodetector comprises in order, a top electrical contact, a top IR absorbing layer for absorbing a first color, a middle electrical contact, a Bragg reflector, a bottom IR absorbing layer for absorbing a second color, a bottom electrical contact, and a reflector. The top contact and the top IR absorbing layer form a diffractive grating for the first color. The Bragg reflector, the bottom IR absorbing layer, the bottom contact, and the reflector form a vertical resonant optical cavity for the second color.

In each embodiment, a first bias is placed across the top IR absorbing layer via the top and middle electrical contacts such that a resulting first current flow is along an axis of the top IR absorbing layer. The magnitude of the resulting first current flow is indicative of the quantity of the first color of IR radiation absorbed by the top IR absorbing layer. Likewise, a second bias is placed across the bottom IR absorbing layer via the middle and bottom electrical contacts such that a resulting second current flow is along an axis of the bottom IR absorbing layer. The magnitude of the resulting second current flow is indicative of the quantity of the second color of IR radiation absorbed by the bottom IR absorbing layer.

Photodetectors comprising a single two-color detector, a one-dimensional line array of photodetectors, or a two-dimensional area array of photodetectors are envisioned. Depending upon the specific embodiment, a number of different material systems may be used to form the starting material.

BRIEF DESCRIPTION OF THE DRAWINGS

The present invention is described in reference to the following Detailed Description and the drawings in which.

DETAILED DESCRIPTION OF THE PREFERRED EMBODIMENTS

Various embodiments of the present invention are described in detail with reference to the drawings with corresponding elements having corresponding numbers throughout the drawings.

Figure 1:
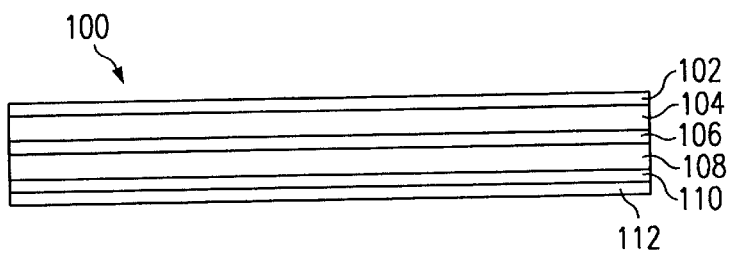
FIG. 1 is a cross-sectional view of the starting material for the first and second embodiments of the present invention.

FIG. 1 is a cross sectional view of the starting material 100 used in fabricating a two-color infrared (IR) photodetector in accordance with both the first and second embodiments. The starting material 100 includes a series of laminae formed in succession. A top contact 102 is formed of doped semiconductor material. The top contact 102 is preferably heavily doped to reduce contact resistance and has a thickness of approximately 0.2 to 0.5 $\mu$m. A top IR absorbing layer 104 is formed of semiconductor material that absorbs IR radiation in a first IR wavelength band, i.e., a first color. The top IR absorbing layer 104 preferably has a thickness of between 0.4 and 1.0 $\mu$m. A middle contact 106 is formed of doped semiconductor material. The middle contact 106 is preferably heavily doped to reduce contact resistance and has a thickness of approximately 0.2 to 0.5 $\mu$m. A bottom IR absorbing layer 108 is formed of semiconductor material that absorbs IR radiation in a second IR wavelength band, i.e., a second color. The bottom IR absorbing layer 108 preferably has a thickness of between 0.3 and 1.0 $\mu$m. A bottom contact 110 is formed of doped semiconductor material. The bottom contact 110 is preferably heavily doped to reduce contact resistance and has a thickness of approximately 0.2 to 0.5 $\mu$m. A reflector 112 that is highly reflective to both the first and second bands of IR radiation completes the starting material 100. The reflector 112 is preferably formed of a metal such as gold or aluminum, or an alloy of two or more metals. The thickness of the reflector 112 is preferably between 0.1 and 0.25 $\mu$m. Alternatively, the reflector 112 can be formed of a Bragg reflector designed to be highly reflective to both the first and second bands of IR radiation. Further, the reflector 112 is preferably planar.

The top IR absorbing layer 104 and the bottom IR absorbing layer 108 can be formed of several different materials, two of which will be examined in detail hereinafter. The preferred material for use is the GaAs material system that includes alloys such as AlGaAs and InGaAs. Quantum well IR photodetectors (QWIPs) and Enhanced QWIPs (EQWIPs) have demonstrated high levels of performance using GaAs/AlGaAs multiple quantum well (MQW) IR absorbing layers.

Figure 2A:
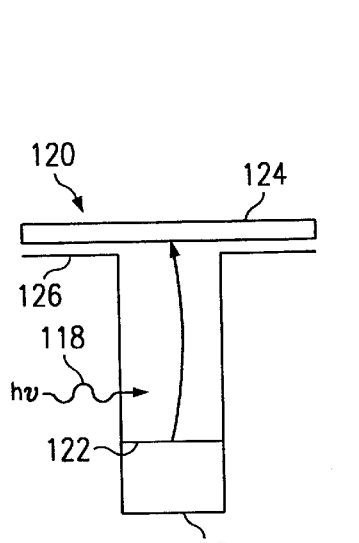
FIGS. 2a–d are energy band diagrams for different starting material structures for use in the present invention.
Figure 2B:
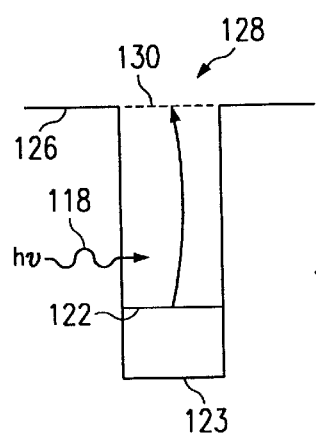
Figure 2C:
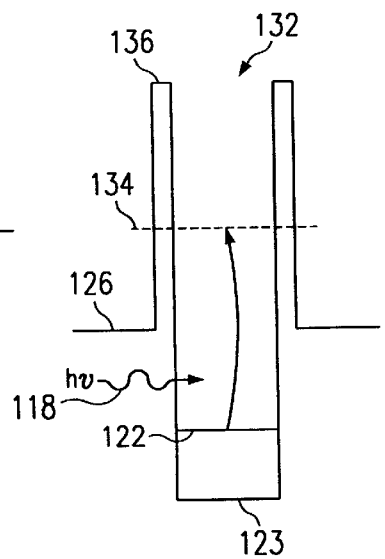

FIGS. 2a through 2c illustrate the conduction band energy band diagram for three different possible IR absorption methods using MQW material. FIG. 2a illustrates bound to continuum (BTC) type material 120. In BTC type material 120, the IR radiation is absorbed when an incident photon 118 excites a ground state or bound electron 122 from a quantum well 123 into the energy continuum 124 above the barrier energy 126. Due to quantum mechanical selection rules, the incident photon 118 must have an electric field component that is normal to the plane of the quantum well 123 if the incident photon 118 is to be absorbed by a lattice matched material such as GaAs/AlGaAs. By applying an electric field across the BTC type material 120, the excited electron is swept from the material and detected in an external circuit. Example material parameters for the BTC type material 120 include a doped GaAs quantum well 123 having a thickness of 20 to 40 Å, and an undoped $Al_xGa_{1-x}$As barrier having an aluminum content X of 0.2 to 0.6 and a thickness of 300 to 500 Å. The specific quantum well 123 thickness and barrier composition typically control the specific wavelengths of IR radiation absorbed by the BTC type material 120. For absorption in the middle wavelength IR (MWIR), corresponding to radiation having a wavelength of 3 to 5 $\mu$m, the BTC type material 120 will require an aluminum content X in the range of 0.4 to 0.6. For absorption in the long wavelength IR (LWIR), corresponding to radiation having a wavelength of 8 to 12 $\mu$m, the BTC type material 120 will require an aluminum content X in the range of 0.2 to 0.4.

FIG. 2b illustrates bound to quasi-continuum (BTQC) type material 128. In BTQC material, the IR radiation is absorbed when an incident photon 118 excites a ground state or bound electron 122 from a quantum well 123 into an energy state 130 approximately equal to the barrier energy 126. By applying an electric field across the BTQC type material 128, the excited electron is swept from the material and detected in an external circuit. Example material parameters for the BTQC type material 128 are quite similar to the BTC type material 120, with the exception of the quantum well 123 thickness. A slightly wider quantum well 123, having a thickness of 25 to 50 Å, is required to create the energy state 130 that is approximately equal to the barrier energy. Like the BTC type material 120, the BTQC IR absorption wavelengths are typically controlled by the specific quantum well 123 thickness and barrier composition.

FIG. 2c illustrates double barrier (DB) type material 132. In DB type material 132, the IR radiation is absorbed when an incident photon 118 excites a ground state or bound electron 122 from a quantum well 123 into an energy state 134 significantly greater than the barrier energy 126, but less than the edge barrier energy 136. By applying an electric field across the DB type material 132, the excited electron is swept from the material and detected in an external circuit. Example material parameters for the DB type material 132 are generally similar to the BTC type material 120, with the exception of the inclusion of the edge barriers. The edge barriers are typically AlAs and have a thickness of 10 to 20 Å. Due to the edge barriers, DB type material 132 is best suited for absorbing MWIR radiation that requires a larger energy difference between the bound and excited states than does LWIR radiation.

The use of MQW material for the top IR absorbing layer 104 and the bottom IR absorbing layer 108 will thus require two different designs. As described above, this can be done by using barrier aluminum contents and quantum well 123 thicknesses that differ between the top IR absorbing layer 104 and the bottom IR absorbing layer 108. In any of the BTC type material 120, the BTQC type material 128, and the DB type material 132, the quantum well 123 can alternatively be $In_YGa_{1-Y}As$, wherein the indium content Y is in the range of 0.00 to 0.15 . A further alternative is the use of a material system such as InGaAs/InAlAs, InGaAs/InP, or various other III-V or II-VI based material systems. Yet another alternative is the use of p-type MQW material in which a ground state energy hole is excited during absorption of the incident photon 118. It should be noted that p-type MQW material places no requirements on the polarization of the photon's electric field. Molecular beam epitaxy (MBE) or metal-organic chemical vapor deposition (MOCVD) can be used to form the BTC type material 120, the BTQC type material 128, the DB type material, and the p-type material from the various III-V and II-VI material systems.

Figure 2D:
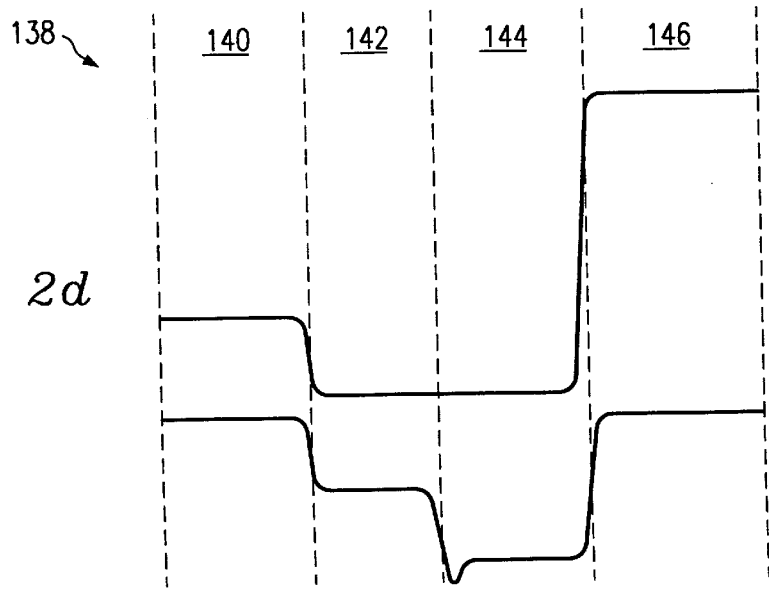

FIG. 2d illustrates the use of HgCdTe to form the starting material 138. FIG. 2d illustrates a top contact 140 formed of P-type $Hg_{0.74}Cd_{0.26}Te$, a top IR absorbing layer 142 formed of n-type $Hg_{0.77}Cd_{0.23}Te$, a bottom IR absorbing layer 144 formed of N-type $Hg_{0.69}Cd_{0.31}Te$, and a bottom contact 146 formed of P-type $Hg_{0.60}Cd_{0.40}Te$. Through the appropriate fabrication processing, the top IR absorbing layer 142 can operate as a middle contact due to its narrow bandgap and corresponding low resistance. Preferable layer thicknesses for the HgCdTe starting material 138 are approximately the same as the corresponding MQW starting material with the exception of the missing middle contact layer. It should be noted the specific alloy compositions of this example result in a MWIR/LWIR two-color photodetector.

The Hg content in the top IR absorbing layer 142 and the bottom IR absorbing layer 144 can be adjusted depending upon the two desired IR wavelength bands. As with the MQW-based materials, the HgCdTe structure can be formed by MBE or MOCVD. In contrast to the MQW-based materials, HgCdTe is a direct bandgap material and does not place any requirement on the polarization of the IR radiation to be absorbed.

Figure 3:
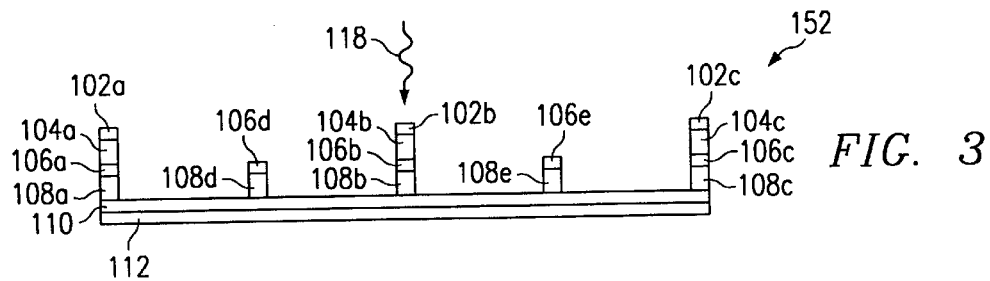
FIG. 3 is a cross-sectional view of the first embodiment of the present invention.

A detector 152 according to the first embodiment is illustrated in FIG. 3 and can be formed from any of the various starting materials described above. The first embodiment is formed through a process comprising two etching steps and a metal deposition step thereby fabricating the two-color photodetector 152. The first etch process removes a portion of the top contact 102 and the top IR absorbing layer 104 resulting in top contact elements 102a–c, and top IR absorbing layer elements 104a–c. The second etch process removes a portion of the middle contact 106 and the bottom IR absorbing layer resulting in middle contact elements 106a–e and bottom IR absorbing layer elements 108a–e. The resulting width of the top contact elements 102a–c, the top IR absorbing layer elements 104a–c, the middle contact elements 106a–e, the bottom IR absorbing layer elements 108a–e is from 0.8 to 1.6 μm depending upon the design. The reflector 112 is deposited on the side opposite the etched portion. The fabrication process need not be conducted in this sequence.

While the above etching processes may appear difficult, two different possible approaches to the processes have been developed. Both processes are based upon the difference in etch rates of different materials. In the simplest solution, the etch rate of the middle contact 106 is significantly lower than the etch rate of the top IR absorbing layer 104. In this case, the etch can be timed to ensure the top IR absorbing layer 104 is completely removed with little fear of removing much of the middle contact 106. The second solution would be used in the case where the etch rate between the top IR absorbing layer 104 and the middle contact 106 is similar. In this case, an etch stop layer (not illustrated) is placed between the top IR absorbing layer 104 and the middle contact 106. The selected etch stop layer material must have an etch rate that is significantly lower than the etch rate of the top IR absorbing layer 104. As an example, the etch rate of $Al_{0.6}Ga_{0.4}As$ is significantly less than the etch rate of $Al_{0.3}Ga_{0.7}As$. As the top IR absorbing layer 104 may comprise $GaAs/Al_{0.3}Ga_{0.7}As$ MQW material, an etch stop comprised of $Al_{0.6}Ga_{0.4}As$ is feasible.

Two alternative structures are also possible. As seen in FIG. 3, the etching is stopped at the interface between the bottom IR absorbing layer 108 and the bottom contact 110. The first alternative, not illustrated, is to etch partially into the bottom contact. The second alternative, also not illustrated, is to etch completely through the bottom contact 110 to the reflector 112. These two alternatives provide an additional degree of design freedom. The second alternative also offers the advantage that as the reflector 112 preferably comprises a metal such as gold that has an extremely low etch rate, the second etch process is simplified.

Figure 4:
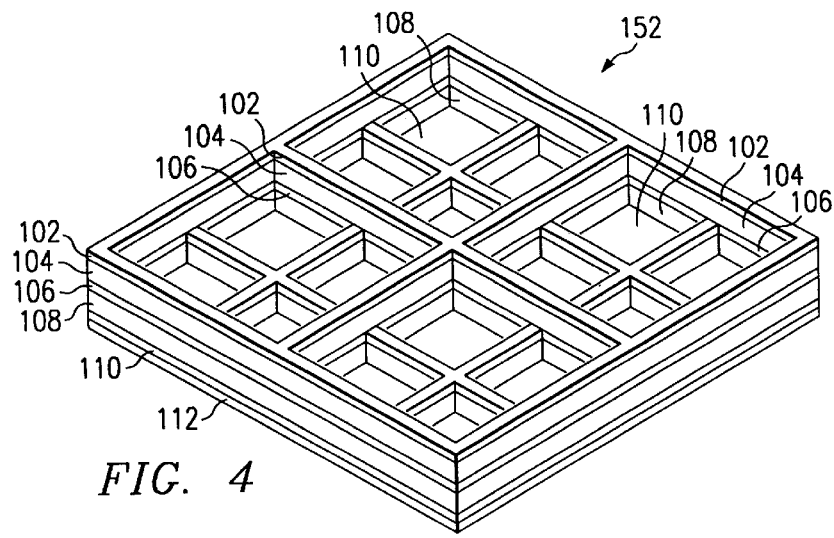
FIG. 4 is a perspective view of the first embodiment of the present invention.
Figure 5:
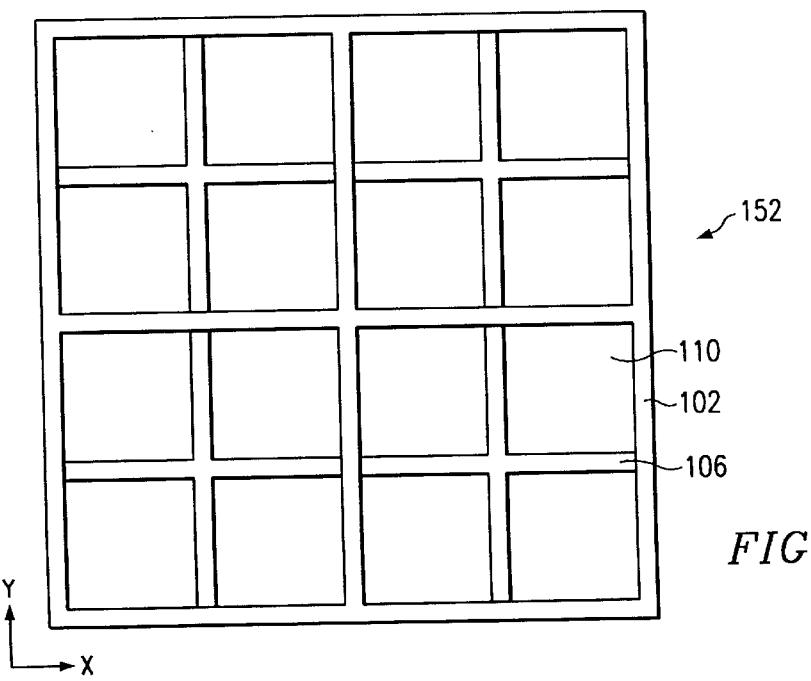
FIG. 5 is a top down view of the first embodiment of the present invention, FIGS. 6a, b are high electric field absorption plots from an electromagnetic simulation of the first embodiment of the present invention.

As can be seen in FIG. 3, and also in FIGS. 4 and 5, two different ridge heights exist in the two-color photodetector 152. Furthermore, the period of the ridges formed in the top IR absorbing layer 104 is an integer multiple of the period of the ridges formed in the bottom IR absorbing layer 108. The reason for the two ridge heights and the integer multiple requirement will be explained hereinafter.

Figure 6A:
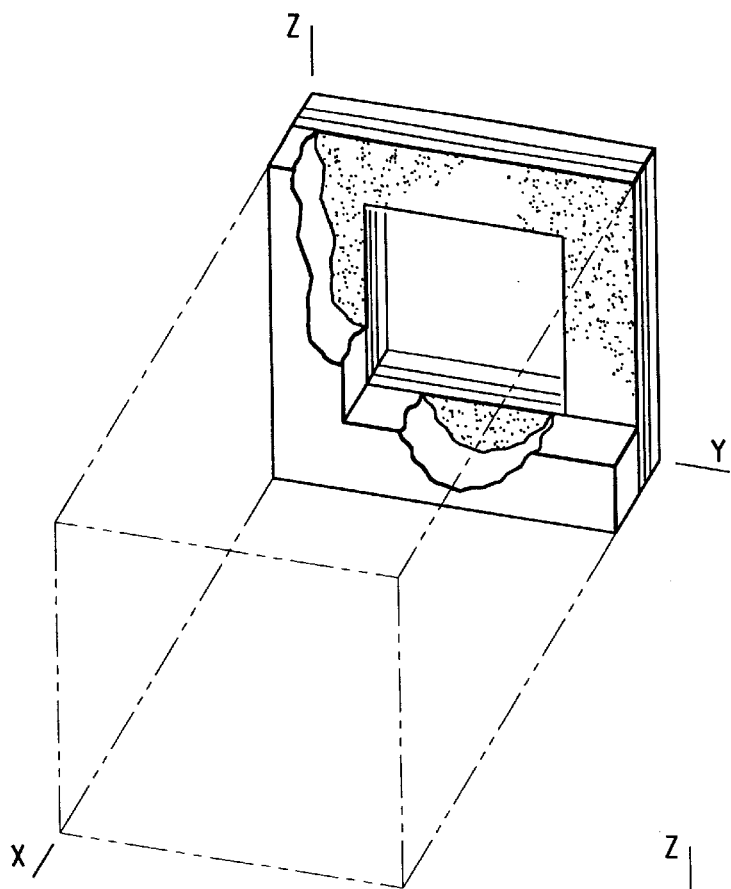
Figure 6B:
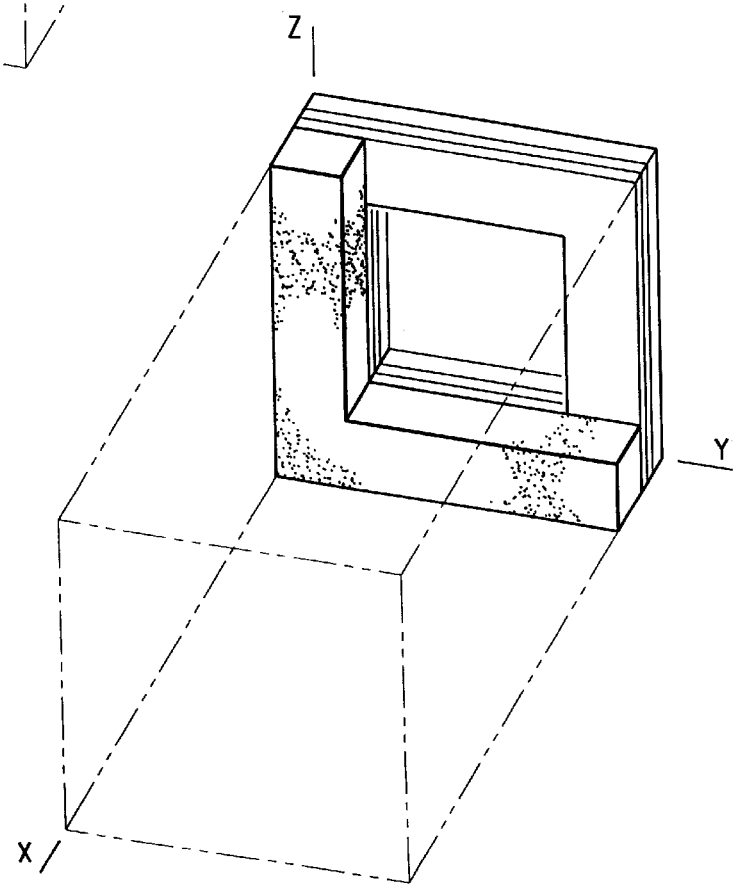

The two-color photodetector 152 forms a diffractive resonant optical cavity that resonates at two different wavelengths for IR radiation incident on the two-color photodetector 152 from the top contact 102 side. The first resonant wavelength is primarily controlled by the period of the top IR absorbing layer 104, while the second resonant wavelength is primarily controlled by the period of the bottom IR absorbing layer 108. Electromagnetic field simulations of the two-color photodetector 152 have shown that the most efficient resonant optical cavity designs include a top IR absorbing layer ridge period that is an integer multiple of the bottom IR absorbing layer ridge period. As an example, a period of 3.5 μm for the bottom IR absorbing ridge period and a period of 7.0 μm for the top IR absorbing ridge period (a factor of two) has yielded strong optical resonances for IR radiation having a wavelength of 4.1 and 8.5 μm. This, and similar designs, are especially useful as the atmosphere transmits IR radiation for long distances in the MWIR and the LWIR wavelength ranges. The given example provides regions of high electric field concentration within the correct IR absorbing layers. This is shown in FIG. 6a that illustrates the high electric field regions in the bottom IR absorbing layer 108 when 4.1 μm IR radiation is directed toward the two-color photodetector 152 as found through an electromagnetic simulation. FIG. 6b illustrates the high electric field regions in the top IR absorbing layer 104 when 8.5 μm IR radiation is directed toward the two-color photodetector 152.

It must be noted that in contrast to conventional two-color IR photodetectors, the IR radiation is incident first on the longer wavelength IR absorbing layer. In conventional two-color IR photodetectors, if the IR radiation were incident on the longer wavelength IR absorbing layer, this longer wavelength IR absorbing layer would absorb the shorter wavelength IR radiation as well. This would result in significant cross-talk within the longer wavelength signal as it would also include a significant shorter wavelength signal component. However, as noted above with respect to the first embodiment, the longer wavelength radiation generates high electric field regions in the top IR absorbing layer 104 corresponding to the longer wavelength absorbing material. Likewise, the shorter wavelength radiation generates high electric field regions in the bottom IR absorbing layer 108 corresponding to the shorter wavelength absorbing material. As the incident IR radiation resonates in the appropriate absorbing material, the two-color photodetector 152 has little cross-talk between the longer wavelength signal and the shorter wavelength signal.

The removal of both top IR absorbing layer 104 material and bottom IR absorbing layer 108 material provides several additional advantages. By creating the diffractive resonant optical cavity, the photoresponse of the two-color photodetector 152 is enhanced as IR radiation of the appropriate wavelength resonates within the cavity increasing absorption. Thus, the cavity improves the signal generated or quantum efficiency of the two-color photodetector 152. Secondly, the dark current generated is reduced. The dark current is generated within the top IR absorbing layer 104 and the bottom IR absorbing layer 108. By removing significant portions of these layers, a reduction in dark current is observed. The dark current generates noise within the signal from the two-color photodetector 152. As this dark current induced noise is the primary source of noise under certain operating conditions, reducing the dark current is important to improving the sensitivity of the two-color photodetector 152. As the diffractive resonant optical cavity increases quantum efficiency and reduces dark current and therefore noise, the two-color photodetector 152 has a higher signal to noise ratio or sensitivity when compared to other two-color photodetector approaches.

While the first embodiment was illustrated with equal periods in both the X and Y directions as seen in FIG. 5, this need not be the case. For an application that requires broader first color and second color spectral response, a different period may be used in the X and Y directions. By increasing the period in the Y direction by 10% relative to the period in the X direction in the above example, the first color spectral response could include resonances at 4.1 and 4.6 $\mu$m while the second color spectral response could include resonances at 8.5 and 9.2 $\mu$m. Thus, slightly varying the periodicity in the two perpendicular directions can broaden the spectral response, though the magnitude of the photoresponse will decrease.

Furthermore, while the first embodiment was illustrated with equal ridge widths for both the top IR absorbing layer elements 104a–c and the bottom IR absorbing layer elements 108a–e, this need not be the case. The use of wider bottom IR absorbing elements 108a–e relative to top IR absorbing elements 104a–c provides an additional degree of freedom when designing the two-color photodetector 152.

Figure 7:
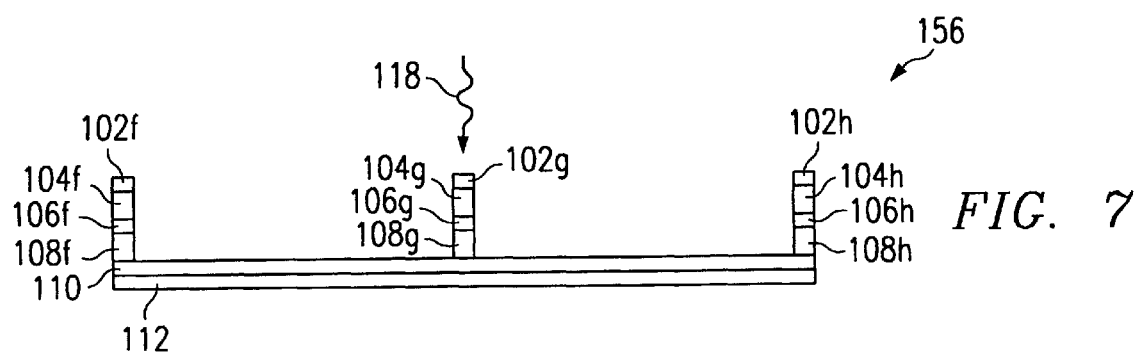
FIG. 7 is a cross-sectional view of the second embodiment of the present invention.

The second embodiment, as illustrated in FIG. 7, requires only a single etch process to remove a portion of the top contact 102, the top IR absorbing layer 104, the middle contact 106, and the bottom IR absorbing layer 108. As with the first embodiment, the etching may actually proceed partially into the bottom contact 110 or completely through it to the underlying planar reflector 112. The etch process thus results in top contact elements 102f–h, top IR absorbing layer elements 104f–h, middle contact elements 106f–h, and bottom IR absorbing layer elements 108f–h. The use of a single etch process significantly simplifies the fabrication process but reduces performance for the reason described below.

Figure 8:
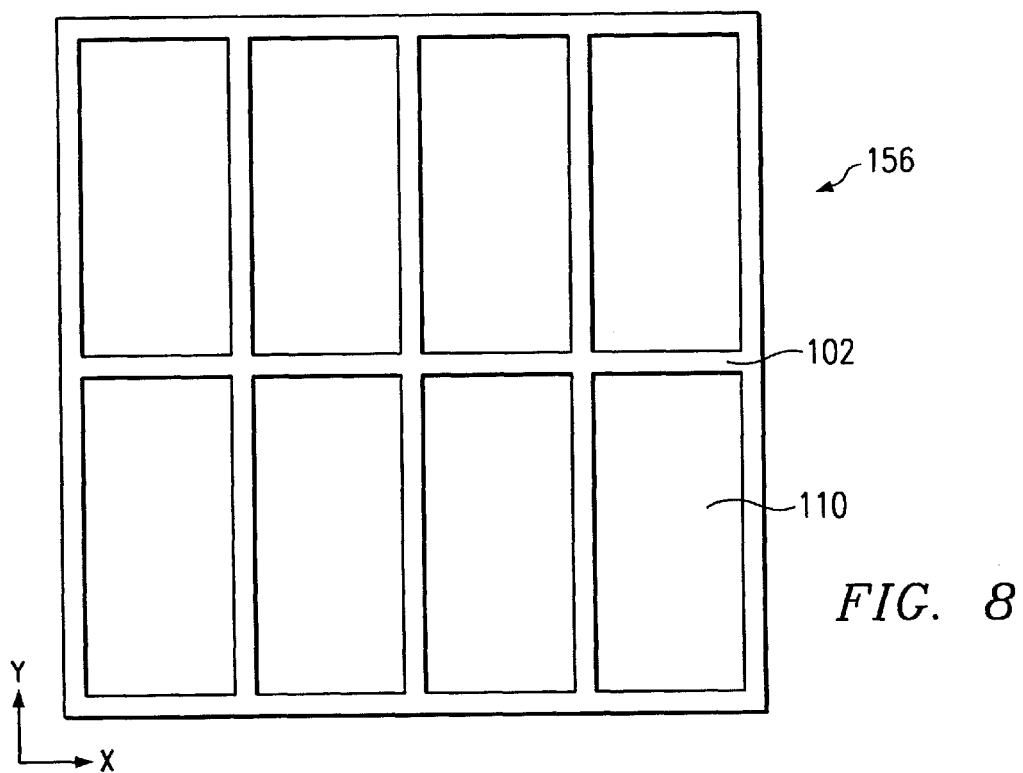
FIG. 8 is a top down view of the second embodiment of the present invention.

In the second embodiment, the periodicity in the X and Y directions is different as seen in FIG. 8. The shorter wavelength color is more strongly diffracted by the grating in the X direction while the longer wavelength color is more strongly diffracted by the grating in the Y direction for IR radiation incident on the two-color photodetector 156 from the top contact 102 side. The design process is simpler in the second embodiment as the periodicity in each direction can quickly be optimized. However, as each wavelength color is most efficiently coupled in only one direction corresponding to one polarization, photoresponse to the second direction or corresponding to polarization is significantly reduced. Thus, an engineering trade-off is required when selecting between the first and second embodiments.

As indicated above, when using MQW material for the top IR absorbing layer 104 and/or the bottom IR absorbing layer 108, the IR radiation must have an electric field component that is perpendicular to the plane of the quantum well 123. It has been found, both experimentally and through theoretical modeling, that the diffractive resonant optical cavity of the type found in the first and second embodiments is efficient at rotating the plane of electric field polarization of the incident IR radiation. This is important, as the incident IR radiation will typically be normally incident upon the two-color photodetector 152 or 156. The normally incident IR radiation will have its electric field polarized in the plane of the quantum well 123 and thus little IR radiation would be absorbed. Therefore, use of the diffraction resonant optical cavity design of the first and second embodiments is quite advantageous.

Figure 9:
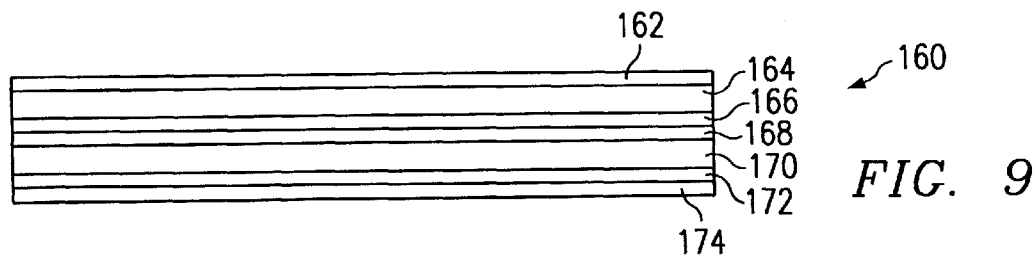
FIG. 9 is a cross-sectional view of the starting material for the third embodiment of the present invention.

FIG. 9 is a cross sectional view of the starting material 160 used in fabricating a two-color photodetector in accordance with a third embodiment. The starting material 160 includes a series of laminae formed in succession. A top contact 162 is formed of doped semiconductor material. The top contact 162 is preferably heavily doped to reduce contact resistance and has a thickness of approximately 0.2 to 0.5 $\mu$m. A top IR absorbing layer 164 is formed of semiconductor material that absorbs IR radiation in a first IR wavelength band, i.e., a first color. The top IR absorbing layer 164 preferably has a thickness of between 0.4 and 1.0 $\mu$m. A middle contact 166 is formed of doped semiconductor material. The middle contact 166 is preferably heavily doped to reduce contact resistance and has a thickness of approximately 0.2 to 0.5 $\mu$m. A Bragg reflector 168 is formed of alternating layers of wider and narrower bandgap semiconductor materials. By appropriately selecting the number and thickness of the alternating layers, the Bragg reflector 168 will transmit or reflect IR radiation in a second wavelength band, i.e., a second color. The Bragg reflector 168 must transmit the second color when the IR radiation is incident upon the Bragg reflector 168 from the middle contact 166, but reflect the second color when the IR radiation is incident from a bottom IR absorbing layer 170. Further, the Bragg reflector 168 must reflect the first color when the IR radiation is incident upon the Bragg reflector 168 from the middle contact 166. The bottom IR absorbing layer 170 is formed of semiconductor material that absorbs IR radiation in the second IR wavelength band. A bottom contact 172 is formed of doped semiconductor material. The bottom contact 172 is preferably heavily doped to reduce contact resistance and has a thickness of approximately 0.2 to 0.5 $\mu$m. A reflector 174 that is highly reflective to the second band of IR radiation completes the starting material 160. The thickness of the reflector 174 is preferably between 0.1 and 0.25 $\mu$m, and formed of a metal or metal alloy. The reflector 174 is also preferably planar.

While the first two embodiments could use MQW material for either or both of the IR absorbing layers 104, 108, the third embodiment has different material requirements. The Bragg reflector 168, the bottom IR absorbing layer 170, the bottom contact 172, and the reflector 174 form a vertical resonant optical cavity for IR radiation incident on a two-color photodetector 180 from the top contact 162 side. As this vertical resonant optical cavity does not rotate the polarization direction of the electric field, the bottom IR absorbing layer 170 must be composed of a material that places no polarization requirements on the electric field. The bottom IR absorbing layer 170 can comprise a strained layer MQW IR absorbing layer formed, for example, of InGaAs/AlGaAs. Due to the strain in the strain layer MQW IR absorbing layer, the quantum mechanical selection rules are relaxed and no polarization requirements are placed upon the electric field. Alternatively, the bottom IR absorbing layer 170 can comprise a direct bandgap material such as HgCdTe, InSb or InAs depending upon the desired absorption wavelength range. The thickness of the bottom IR absorbing layer 170 must be selected such that a resonance is formed between the Bragg reflector 168 and the reflector 174. Thus, the total thickness of the bottom IR absorbing layer 170 and the bottom contact 172 must be an integer multiple of a half wavelength of the second color, i.e., $(n*\lambda_{C2})/2$, where n is an integer and $\lambda_{C2}$ is the wavelength of the second color within the bottom IR absorbing layer 170. The resultant vertical resonant optical cavity therefor creates high electric field regions within the bottom IR absorbing layer 170. As a diffractive resonant optical cavity is formed from the top IR absorbing layer 164, the top IR absorbing layer 164 can be either MQW material or direct bandgap material, as found in the first two embodiments.

Figure 10:
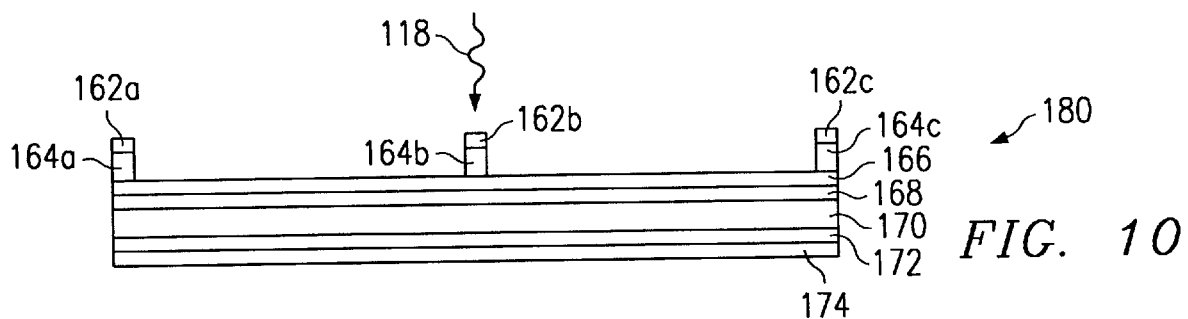
FIG. 10 is a cross-sectional view of the third embodiment of the present invention.

A cross-sectional view of the two-color photodetector 180 according to the third embodiment is illustrated in FIG. 10. The third embodiment is formed through a process comprising one etching step and a metal deposition step thereby fabricating the detector 180. The single etch process removes a portion of the top contact 162 and the top IR absorbing layer 164 resulting in top contact elements 162a–c, and top IR absorbing layer elements 164a–c. The reflector 174 is deposited on the side opposite the etched portion. The fabrication process need not be conducted in this sequence. Additionally, while the detector illustrated in FIG. 10 included stopping the etch process at the top IR absorbing layer 164—middle contact 166 interface, this is not required. The etch process may remove a portion of the middle contact 166, or etch completely through the middle con tact 166 to the Bragg reflector 168. A further alternative is the use of a second Bragg reflector for the reflector 174 instead of a deposited metal reflector.

Figure 11:
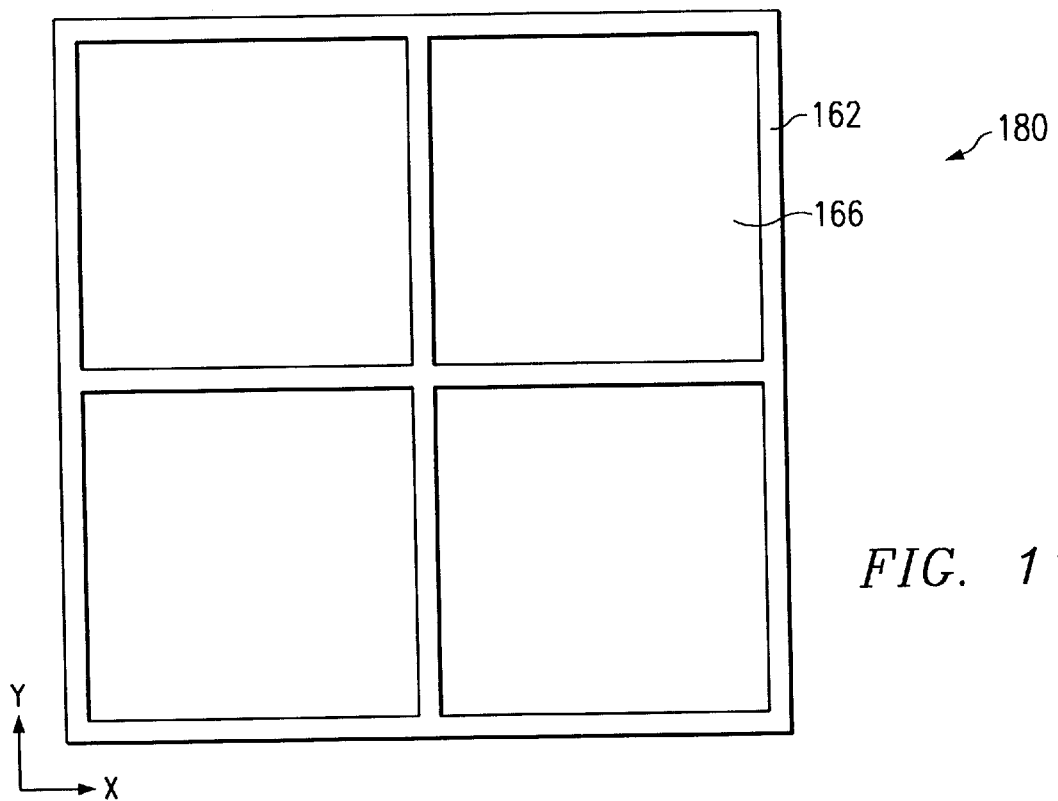
FIG. 11 is a top down view of the third embodiment of the present invention.

FIG. 11 is a top view of detector 180 showing the intersecting ridges formed by the etch process. As with the first and second embodiments, the periodicity in the X and Y directions need not be identical. By having slightly different periods in the X and Y directions, a broader spectral response is achieved within the top IR absorbing layer 164.

While each of the three embodiments has been described and illustrated as a single photodetector, arrays of two-color photodetectors are envisioned. The arrays of photodetectors can be a one-dimensional line array of photodetectors, or a two-dimensional area array of photodetectors. In an application requiring a two-dimensional array of two-color photodetectors, the two-dimensional array of photodetectors can be mated to a silicon-based readout integrated circuit for multiplexing the resulting two-color signals. The mating of the two-dimensional array of photodetectors and the readout circuit can include the use of indium bumps to provide electrical, mechanical, and thermal contact between the photodetectors and the readout circuit.

Although the present invention has been fully described by way of examples with reference to the accompanying drawings, it is to be noted that various changes and modifications will be apparent to those skilled in the art. Therefore, such changes and modifications should be construed as being within the scope of the invention.

What is claimed is:

1. A two-color infrared radiation photodetector comprising:
    a plurality of first elongate infrared radiation absorbing elements for absorbing a first band of infrared radiation, each of the plurality of first elements having first and second opposite longitudinal surfaces, the plurality of first elements comprising a first diffraction grating for the first band of infrared radiation, the first diffraction grating having a first period;
    a plurality of second elongate infrared radiation absorbing elements for absorbing a second band of infrared radiation, each of the plurality of second elements having first and second opposite longitudinal surfaces, the plurality of second elements comprising a second diffraction grating for the second band of infrared radiation, the second diffraction grating having a second period;
    a first electrical contact which includes a plurality of electrically interconnected strips respectively being in electrical contact with and extending along the first surfaces of the plurality of first elements;
    a second electrical contact being disposed between the plurality of first elements and the plurality of second elements, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surfaces of the plurality of second elements, the first contact and the second contact being disposed on opposite longitudinal surfaces of each of the plurality of first elements to provide for current flow through the plurality of first elements in a direction substantially transverse to an axis of the plurality of first elements;
    a third electrical contact being in electrical contact with the second surfaces of the plurality of second elements, the second contact and the third contact being disposed on opposite longitudinal surfaces of each of the plurality of second elements to provide for current flow through the plurality of second elements in a direction substantially transverse to an axis of the plurality of second elements;
    a reflector for the first band of infrared radiation and the second band of infrared radiation, the reflector being disposed on an opposite longitudinal surface of the third contact from the plurality of second elements,
    wherein the first period is an integer multiple of the second period.

2. A two-color infrared radiation photodetector in accordance with claim 1, wherein the plurality of first elements and the plurality of second elements comprise HgCdTe elements.

3. A two-color infrared radiation photodetector in accordance with claim 1, wherein the plurality of first elements and the plurality of second elements comprise multiple quantum well elements.

4. A two-color infrared radiation photodetector in accordance with claim 3 wherein the multiple quantum well elements comprise AlGaAs.

5. A two-color infrared radiation photodetector in accordance with claim 3, wherein the multiple quantum well elements comprise InP wells and $In_xGa_{1-x}As$ barriers.

6. A two-color infrared radiation photodetector in accordance with claim 1, wherein the first band of infrared radiation includes infrared radiation having a longer wavelength than the second band of infrared radiation.

7. A two-color infrared radiation photodetector in accordance with claim 1, wherein a width of the first elements is less than a width of the second elements.

8. A two-color infrared radiation photodetector comprising:

a plurality of first elongate infrared radiation absorbing elements for absorbing a first band of infrared radiation, each of the plurality of first elements having first and second opposite longitudinal surfaces;

a plurality of second elongate infrared radiation absorbing elements for absorbing a second band of infrared radiation, each of the plurality of second elements having first and second opposite longitudinal surfaces;

a first electrical contact which includes a plurality of electrically interconnected strips respectively being in electrical contact with and extending along the first surfaces of the plurality of first elements;

a second electrical contact being disposed between the plurality of first elements and the plurality of second elements, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surfaces of the plurality of second elements, the first contact and the second contact being disposed on opposite longitudinal surfaces of each of the plurality of first elements to provide for current flow through the plurality of first elements in a direction substantially transverse to an axis of the plurality of first elements;

a third electrical contact being in electrical contact with the second surfaces of the plurality of second elements, the second contact and the third contact being disposed on opposite longitudinal surfaces of each of the plurality of second elements to provide for current flow through the plurality of second elements in a direction substantially transverse to an axis of the plurality of second elements;

a reflector for reflecting the first band of infrared radiation and the second band of infrared radiation, the reflector being disposed on an opposite longitudinal surface of the third contact from the plurality of second elements, wherein the plurality of first elements and the plurality of second elements comprise a diffraction grating, the diffraction grating having a first period in a first direction for diffracting the first band of infrared radiation and a second period in a second direction for diffracting the second band of infrared radiation, the second direction being substantially perpendicular to the first direction, and wherein the first band of infrared radiation includes infrared radiation having a longer wavelength than the second band of infrared radiation.

9. A two-color infrared radiation photodetector in accordance with claim 8, wherein the plurality of first elements and the plurality of second elements comprise HgCdTe elements.

10. A two-color infrared radiation photodetector in accordance with claim 8, wherein the plurality of first elements and the plurality of second elements comprise multiple quantum well elements.

11. A two-color infrared radiation photodetector in accordance with claim 10, wherein the multiple quantum well elements comprise AlGaAs.

12. A two-color infrared radiation photodetector in accordance with claim 10, wherein the multiple quantum well elements comprise InP wells and $In_xGa_{1-x}As$ barriers.

13. A two-color infrared radiation photodetector in accordance with claim 8, wherein the first band of infrared radiation includes infrared radiation having a longer wavelength than the second band of infrared radiation.

14. A two-color infrared radiation photodetector comprising:

a plurality of first elongate infrared radiation absorbing elements for absorbing a first band of infrared radiation, each of the plurality of first elements having first and second opposite longitudinal surfaces, the plurality of first elements comprising a diffraction grating for the first band of infrared radiation;

a second infrared radiation absorbing element for absorbing a second band of infrared radiation, the second element having first and second opposite longitudinal surfaces;

a Bragg reflector having first and second opposite longitudinal surfaces, the Bragg reflector for reflecting the first band of infrared radiation if the infrared radiation is incident upon the first surface of the Bragg reflector, the Bragg reflector for transmitting the second band of infrared radiation if the infrared radiation is incident upon the first surface of the Bragg reflector, the Bragg reflector for reflecting the second band of infrared radiation if the infrared radiation is incident upon the second surface of the Bragg reflector, the second element being disposed on the second surface of the Bragg reflector;

a first electrical contact which includes a plurality of electrically interconnected strips respectively being in electrical contact with and extending along the first surfaces of the plurality of first elements;

a second electrical contact being disposed between the plurality of first elements and the Bragg reflector, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surface of the Bragg reflector, the first contact and the second contact being positioned on opposite longitudinal surfaces of each of the plurality of first elements to provide for current flow through the plurality of first elements in a direction substantially transverse to an axis of the plurality of first elements;

a third electrical contact being in electrical contact with the second surface of the second element, the second contact and the third contact being disposed on opposite longitudinal surfaces of the second element to provide for current flow through the second element and the Bragg reflector in a direction substantially transverse to an axis of the second element and the Bragg reflector;

a reflector for reflecting the second band of infrared radiation, the reflector being disposed on an opposite longitudinal surface of the third contact from the second element, wherein a thickness of the second element creates a resonant optical cavity between the Bragg reflector and the reflector for the second band of infrared radiation.

15. A two-color infrared radiation photodetector comprising:

a plurality of first elongate infrared radiation absorbing elements for absorbing a first band of infrared radiation, each of the plurality of first elements comprising multiple quantum well elements, each of the plurality of first elements having first and second opposite longitudinal surfaces, the plurality of first elements comprising a first diffraction grating for the first band of infrared radiation, the first diffraction grating having a first period;

a plurality of second elongate infrared radiation absorbing elements for absorbing a second band of infrared radiation, the second band of infrared radiation including infrared radiation having a shorter wavelength than the first band of infrared radiation, each of the plurality of second elements comprising multiple quantum well elements, each of the plurality of second elements having first and second opposite longitudinal surfaces, the plurality of second elements comprising a second diffraction grating for the second band of infrared radiation, the second diffraction grating having a second period;

a first electrical contact which includes a plurality of electrically interconnected strips respectively being in electrical contact with and extending along the first surfaces of the plurality of first elements;

a second electrical contact being disposed between the plurality of first elements and the plurality of second elements, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surfaces of the plurality of second elements, the first contact and the second contact being disposed on opposite longitudinal surfaces of each of the plurality of first elements to provide for current flow through the plurality of first elements in a direction substantially transverse to an axis of the plurality of first elements;

a third electrical contact being in electrical contact with the second surfaces of the plurality of second elements, the second contact and the third contact being disposed on opposite longitudinal surfaces of each of the plurality of second elements to provide for current flow through the plurality of second elements in a direction substantially transverse to an axis of the plurality of second elements;

a reflector for the first band of infrared radiation and the second band of infrared radiation, the reflector being disposed on an opposite longitudinal surface of the third contact from the plurality of second elements, wherein the first period is an integer multiple of the second period.

16. A two-color infrared radiation photodetector comprising:

a plurality of first elongate infrared radiation absorbing elements for absorbing a first band of infrared radiation, each of the plurality of first elements comprising multiple quantum well elements, each of the plurality of first elements having first and second opposite longitudinal surfaces;

a plurality of second elongate infrared radiation absorbing elements for absorbing a second band of infrared radiation, the second band of infrared radiation including infrared radiation having a shorter wavelength than the first band of infrared radiation, each of the plurality of second elements comprising multiple quantum well elements, each of the plurality of second elements having first and second opposite longitudinal surfaces;

a first electrical contact which includes a plurality of electrically interconnected strips respectively being in electrical contact with and extending along the first surfaces of the plurality of first elements;

a second electrical contact being disposed between the plurality of first elements and the plurality of second elements, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surfaces of the plurality of second elements, the first contact and the second contact being disposed on opposite longitudinal surfaces of each of the plurality of first elements to provide for current flow through the plurality of first elements in a direction substantially transverse to an axis of the plurality of first elements;

a third electrical contact being in electrical contact with the second surfaces of the plurality of second elements, the second contact and the third contact being disposed on opposite longitudinal surfaces of each of the plurality of second elements to provide for current flow through the plurality of second elements in a direction substantially transverse to an axis of the plurality of second elements;

a reflector for reflecting the first band of infrared radiation and the second band of infrared radiation, the reflector being disposed on an opposite longitudinal surface of the third contact from the plurality of second elements, wherein the plurality of first elements and the plurality of second elements comprise a diffraction grating, the diffraction grating having a first period in a first direction for diffracting the first band of infrared radiation and a second period in a second direction for diffracting the second band of infrared radiation, the second direction being substantially perpendicular to the first direction, and wherein the first band of infrared radiation includes infrared radiation having a longer wavelength than the second band of infrared radiation.

17. A two-color infrared radiation photodetector focal plane array including a plurality of photodetector pixel structures, each of the pixel structures comprising:
- a plurality of first elongate infrared radiation absorbing elements for absorbing a first band of infrared radiation, each of the plurality of first elements having first and second opposite longitudinal surfaces, the plurality of first elements comprising a first diffraction grating for the first band of infrared radiation, the first diffraction grating having a first period;
- a plurality of second elongate infrared radiation absorbing elements for absorbing a second band of infrared radiation, each of the plurality of second elements having first and second opposite longitudinal surfaces, the plurality of second elements comprising a second diffraction grating for the second band of infrared radiation, the second diffraction grating having a second period;
- a first electrical contact which includes a plurality of electrically interconnected strips respectively being in electrical contact with and extending along the first surfaces of the plurality of first elements;
- a second electrical contact being disposed between the plurality of first elements and the plurality of second elements, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surfaces of the plurality of second elements, the first contact and the second contact being disposed on opposite longitudinal surfaces of each of the plurality of first elements to provide for current flow through the plurality of first elements in a direction substantially transverse to an axis of the plurality of first elements;
- a third electrical contact being in electrical contact with the second surfaces of the plurality of second elements, the second contact and the third contact being disposed on opposite longitudinal surfaces of each of the plurality of second elements to provide for current flow through the plurality of second elements in a direction substantially transverse to an axis of the plurality of second elements;
- a reflector for the first band of infrared radiation and the second band of infrared radiation, the reflector being disposed on an opposite longitudinal surface of the third contact from the plurality of second elements,
- wherein the first period is an integer multiple of the second period.

18. A two-color infrared radiation photodetector focal plane array in accordance with claim 17, wherein the plurality of first elements and the plurality of second elements of each of the pixel structures comprise HgCdTe elements.

19. A two-color infrared radiation photodetector focal plane array in accordance with claim 17, wherein the plurality of first elements and the plurality of second elements of each of the pixel structures comprise multiple quantum well elements.

20. A two-color infrared radiation photodetector focal plane array in accordance with claim 19 wherein the multiple quantum well elements comprise AlGaAs.

21. A two-color infrared radiation photodetector focal plane array in accordance with claim 19, wherein the multiple quantum well elements comprise InP wells and $In_xGa_{1-x}As$ barriers.

22. A two-color infrared radiation photodetector focal plane array in accordance with claim 17, wherein the first band of infrared radiation includes infrared radiation having a longer wavelength than the second band of infrared radiation.

23. A two-color infrared radiation photodetector focal plane array in accordance with claim 17, wherein a width of the first elements of each of the pixel structures is less than a width of the second elements of each of the pixel structures.

24. A two-color infrared radiation photodetector focal plane array in accordance with claim 17, wherein the focal plane array is a one-dimensional focal plane array.

25. A two-color infrared radiation photodetector focal plane array in accordance with claim 17, wherein the focal plane array is a two-dimensional focal plane array.

26. A two-color infrared radiation photodetector focal plane array including a plurality of photodetector pixel structures, each of the pixel structures comprising:
- a plurality of first elongate infrared radiation absorbing elements for absorbing a first band of infrared radiation, each of the plurality of first elements having first and second opposite longitudinal surfaces;
- a plurality of second elongate infrared radiation absorbing elements for absorbing a second band of infrared radiation, each of the plurality of second elements having first and second opposite longitudinal surfaces;
- a first electrical contact which includes a plurality of electrically interconnected strips respectively being in electrical contact with and extending along the first surfaces of the plurality of first elements;
- a second electrical contact being disposed between the plurality of first elements and the plurality of second elements, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surfaces of the plurality of second elements, the first contact and the second contact being disposed on opposite longitudinal surfaces of each of the plurality of first elements to provide for current flow through the plurality of first elements in a direction substantially transverse to an axis of the plurality of first elements;
- a third electrical contact being in electrical contact with the second surfaces of the plurality of second elements, the second contact and the third contact being disposed on opposite longitudinal surfaces of each of the plurality of second elements to provide for current flow through the plurality of second elements in a direction substantially transverse to an axis of the plurality of second elements;
- a reflector for reflecting the first band of infrared radiation and the second band of infrared radiation, the reflector being disposed on an opposite longitudinal surface of the third contact from the plurality of second elements,
- wherein the plurality of first elements and the plurality of second elements comprise a diffraction grating, the diffraction grating having a first period in a first direction for diffracting the first band of infrared radiation and a second period in a second direction for diffracting the second band of infrared radiation, the second direction being substantially perpendicular to the first direction, and wherein the first band of infrared radiation includes infrared radiation having a longer wavelength than the second band of infrared radiation.

27. A two-color infrared radiation photodetector focal plane array in accordance with claim 26, wherein the plurality of first elements and the plurality of second elements of each of the pixel structures comprise HgCdTe elements.

28. A two-color infrared radiation photodetector focal plane array in accordance with claim 26, wherein the plurality of first elements and the plurality of second elements of each of the pixel structures comprise multiple quantum well elements.

29. A two-color infrared radiation photodetector focal plane array in accordance with claim 28 wherein the multiple quantum well elements comprise AlGaAs.

30. A two-color infrared radiation photodetector focal plane array in accordance with claim 28, wherein the multiple quantum well elements comprise InP wells and $In_xGa_{1-x}As$ barriers.

31. A two-color infrared radiation photodetector focal plane array in accordance with claim 26, wherein the first band of infrared radiation includes infrared radiation having a longer wavelength than the second band of infrared radiation.

32. A two-color infrared radiation photodetector focal plane array in accordance with claim 26, wherein a width of the first elements of each of the pixel structures is less than a width of the second elements of each of the pixel structures.

33. A two-color infrared radiation photodetector focal plane array in accordance with claim 26, wherein the focal plane array is a one-dimensional focal plane array.

34. A two-color infrared radiation photodetector focal plane array in accordance with claim 26, wherein the focal plane array is a two-dimensional focal plane array.

35. A two-color infrared radiation photodetector focal plane array including a plurality of photodetector pixel structures, each of the pixel structures comprising:

a plurality of first elongate infrared radiation absorbing elements for absorbing a first band of infrared radiation, each of the plurality of first elements having first and second opposite longitudinal surfaces, the plurality of first elements comprising a diffraction grating for the first band of infrared radiation;

a second infrared radiation absorbing element for absorbing a second band of infrared radiation, the second element having first and second opposite longitudinal surfaces;

a Bragg reflector having first and second opposite longitudinal surfaces, the Bragg reflector for reflecting the first band of infrared radiation if the infrared radiation is incident upon the first surface of the Bragg reflector, the Bragg reflector for transmitting the second band of infrared radiation if the infrared radiation is incident upon the first surface of the Bragg reflector, the Bragg reflector for reflecting the second band of infrared radiation if the infrared radiation is incident upon the second surface of the Bragg reflector, the second element being disposed on the second surface of the Bragg reflector;

a first electrical contact which includes a plurality of electrically interconnected strips respectively being in electrical contact with and extending along the first surfaces of the plurality of first elements;

a second electrical contact being disposed between the plurality of first elements and the Bragg reflector, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surface of the Bragg reflector, the first contact and the second contact being positioned on opposite longitudinal surfaces of each of the plurality of first elements to provide for current flow through the plurality of first elements in a direction substantially transverse to an axis of the plurality of first elements;

a third electrical contact being in electrical contact with the second surface of the second element, the second contact and the third contact being disposed on opposite longitudinal surfaces of the second element to provide for current flow through the second element and the Bragg reflector in a direction substantially transverse to an axis of the second element and the Bragg reflector;

a reflector for reflecting the second band of infrared radiation, the planar reflector being disposed on an opposite longitudinal surface of the third contact from the second element, wherein a thickness of the second element creates a resonant optical cavity between the Bragg reflector and the reflector for the second band of infrared radiation.

36. A two-color infrared radiation photodetector focal plane array including a plurality of photodetector pixel structures, each of the pixel structures comprising:

a plurality of first elongate infrared radiation absorbing elements for absorbing a first band of infrared radiation, each of the plurality of first elements comprising multiple quantum well elements, each of the plurality of first elements having first and second opposite longitudinal surfaces, the plurality of first elements comprising a first diffraction grating for the first band of infrared radiation, the first diffraction grating having a first period;

a plurality of second elongate infrared radiation absorbing elements for absorbing a second band of infrared radiation, the second band of infrared radiation including infrared radiation having a shorter wavelength than the first band of infrared radiation, each of the plurality of second elements comprising multiple quantum well elements, each of the plurality of second elements having first and second opposite longitudinal surfaces, the plurality of second elements comprising a second diffraction grating for the second band of infrared radiation, the second diffraction grating having a second period;

a first electrical contact which includes a plurality of electrically interconnected strips respectively being in electrical contact with and extending along the first surfaces of the plurality of first elements;

a second electrical contact being disposed between the plurality of first elements and the plurality of second elements, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surfaces of the plurality of second elements, the first contact and the second contact being disposed on opposite longitudinal surfaces of each of the plurality of first elements to provide for current flow through the plurality of first elements in a direction substantially transverse to an axis of the plurality of first elements;

a third electrical contact being in electrical contact with the second surfaces of the plurality of second elements, the second contact and the third contact being disposed on opposite longitudinal surfaces of each of the plurality of second elements to provide for current flow through the plurality of second elements in a direction substantially transverse to an axis of the plurality of second elements;

a reflector for the first band of infrared radiation and the second band of infrared radiation, the reflector being disposed on an opposite longitudinal surfaces of the third contact from the plurality of second elements, wherein the first period is an integer multiple of the second period.

37. A two-color infrared radiation photodetector focal plane array in accordance with claim 36, wherein the focal plane array is a one-dimensional focal plane array.

38. A two-color infrared radiation photodetector focal plane array in accordance with claim 36, wherein the focal plane array is a two-dimensional focal plane array.

39. A two-color infrared radiation photodetector focal plane array including a plurality of photodetector pixel structures, each of the pixel structures comprising:

a plurality of first elongate infrared radiation absorbing elements for absorbing a first band of infrared radiation, each of the plurality of first elements comprising multiple quantum well elements, each of the plurality of first elements having first and second opposite longitudinal surfaces;

a plurality of second elongate infrared radiation absorbing elements for absorbing a second band of infrared radiation, the second band of infrared radiation including infrared radiation having a shorter wavelength than the first band of infrared radiation, each of the plurality of second elements comprising multiple quantum well elements, each of the plurality of second elements having first and second opposite longitudinal surfaces;

a first electrical contact which includes a plurality of electrically interconnected strips respectively being in electrical contact with and extending along the first surfaces of the plurality of first elements;

a second electrical contact being disposed between the plurality of first elements and the plurality of second elements, the second electrical contact having first and second opposite longitudinal surfaces, the second electrical contact including a plurality of electrically interconnected strips, the first surfaces of the second electrical contact being in electrical contact with and extending along the second surfaces of the plurality of first elements, the second surfaces of the second electrical contact being in electrical contact with and extending along the first surfaces of the plurality of second elements, the first contact and the second contact being disposed on opposite longitudinal surfaces of each of the plurality of first elements to provide for current flow through the plurality of first elements in a direction substantially transverse to an axis of the plurality of first elements;

a third electrical contact being in electrical contact with the second surfaces of the plurality of second elements, the second contact and the third contact being disposed on opposite longitudinal surfaces of each of the plurality of second elements to provide for current flow through the plurality of second elements in a direction substantially transverse to an axis of the plurality of second elements;

a reflector for reflecting the first band of infrared radiation and the second band of infrared radiation, the reflector being disposed on an opposite longitudinal surface of the third contact from the plurality of second elements, wherein the plurality of first elements and the plurality of second elements comprise a diffraction grating, the diffraction grating having a first period in a first direction for diffracting the first band of infrared radiation and a second period in a second direction for diffracting the second band of infrared radiation, the second direction being substantially perpendicular to the first direction, and wherein the first band of infrared radiation includes infrared radiation having a longer wavelength than the second band of infrared radiation.

40. A two-color infrared radiation photodetector focal plane array in accordance with claim 39, wherein the focal plane array is a one-dimensional focal plane array.

41. A two-color infrared radiation photodetector focal plane array in accordance with claim 39, wherein the focal plane array is a two-dimensional focal plane array.

* * * * *